US011096320B2

United States Patent
Onishi et al.

(10) Patent No.: US 11,096,320 B2
(45) Date of Patent: Aug. 17, 2021

(54) COMPONENT MOUNTER AND NOZZLE IMAGING METHOD

(71) Applicant: YAMAHA HATSUDOKI KABUSHIKI KAISHA, Shizuoka (JP)

(72) Inventors: Tadashi Onishi, Shizuoka (JP); Akinobu Uesugi, Shizuoka (JP)

(73) Assignee: YAMAHA HATSUDOKI KABUSHIKI KAISHA, Shizuoka (JP)

( * ) Notice: Subject to any disclaimer, the term of this patent is extended or adjusted under 35 U.S.C. 154(b) by 333 days.

(21) Appl. No.: 15/757,634

(22) PCT Filed: Sep. 10, 2015

(86) PCT No.: PCT/JP2015/075712
§ 371 (c)(1),
(2) Date: Mar. 5, 2018

(87) PCT Pub. No.: WO2017/042929
PCT Pub. Date: Mar. 16, 2017

(65) Prior Publication Data
US 2019/0029150 A1    Jan. 24, 2019

(51) Int. Cl.
*H05K 13/04* (2006.01)
*H05K 13/08* (2006.01)

(52) U.S. Cl.
CPC ....... *H05K 13/041* (2018.08); *H05K 13/0419* (2018.08); *H05K 13/0452* (2013.01); *H05K 13/0812* (2018.08)

(58) Field of Classification Search
CPC ............. H05K 13/0409; H05K 13/041; H05K 13/0452; H05K 13/0812
See application file for complete search history.

(56) References Cited

U.S. PATENT DOCUMENTS

| 2012/0287437 A1* | 11/2012 | Onishi | H05K 13/0452 356/446 |
| 2017/0325370 A1* | 11/2017 | Nozawa | H05K 13/0413 |

FOREIGN PATENT DOCUMENTS

| JP | 2008-311476 A | 12/2008 |
| JP | 2009-130014 A | 6/2009 |

(Continued)

OTHER PUBLICATIONS

International Search Report issued in PCT/JP2015/075712; dated Dec. 15, 2015.

(Continued)

*Primary Examiner* — Livius R. Cazan
(74) *Attorney, Agent, or Firm* — Studebaker & Brackett PC

(57) ABSTRACT

A plurality of nozzles are arranged at intervals of a center-to-center distance along a circumferential orbit around the predetermined rotation axis integrally. The nozzle that is positioned at the working position is changed by rotating the plurality of nozzles around the predetermined rotation axis. At that time, regardless of the manner in which the nozzle positioned at the working position is changed, the nozzle approaching the working position, and the nozzle moving away from the working position, move within an imaging target range having a width smaller than twice the center-to-center distance with the working position as the center along the circumferential orbit. Then, a camera images the nozzle which is moving within the imaging target range. Thus, it is not necessary to temporarily stop the nozzle for imaging, and as a result, imaging of the nozzles is performed efficiently.

20 Claims, 8 Drawing Sheets

(56) References Cited

FOREIGN PATENT DOCUMENTS

| JP | 2009-283572 A | 12/2009 |
|----|---------------|---------|
| JP | 2012-212947 A | 11/2012 |
| JP | 2012-238726 A | 12/2012 |
| JP | 2014-220269 A | 11/2014 |

OTHER PUBLICATIONS

An Office Action; "Notification of Reasons for Refusal," issued by the Japanese Patent Office dated Oct. 30, 2018, which corresponds to Japanese Patent Application No. 2017-538791 and is related to U.S. Appl. No. 15/757,634; with English language translation.

* cited by examiner

COMPONENT MOUNTER AND NOZZLE IMAGING METHOD

CROSS-REFERENCE TO RELATED APPLICATION

This application is a National Stage of International Patent Application No. PCT/JP2015/075712, filed Sep. 10, 2015, the entire content of which is incorporated herein by reference.

BACKGROUND

Technical Field

The present disclosure relates to a nozzle imaging technique for imaging a nozzle which is used for holding and mounting a component by a mounting head.

Background Art

In Japanese Patent Application No. 2009-130014, disclosed is a component mounting apparatus in which a plurality of adsorption nozzles are arranged circumferentially at regular pitches. This component mounting apparatus intermittently rotates the plurality of adsorption nozzles in a constant direction by one pitch, to thereby cause each adsorption nozzle to be sequentially positioned at a working position, and performs component mounting by using the adsorption nozzle at the working position. Further, a precedent position and a subsequent position are provided before and after the working position, respectively, away from the working position by one pitch, and a camera images the adsorption nozzle which stops at each of the precedent position and the subsequent position. Thus, by imaging the adsorption nozzle before and after the component mounting, it is checked that the adsorption nozzle adsorbs a component before the component mounting and the component is removed from the adsorption nozzle after the component mounting.

SUMMARY

Thus, the above-described component mounting apparatus intermittently rotates the plurality of adsorption nozzles in a constant direction by one pitch, to thereby cause each adsorption nozzle to be sequentially positioned at the working position. Therefore, while one nozzle performs the component mounting at the working position, a nozzle which is to perform the component mounting next at the working position stops at the precedent position. For this reason, the imaging of the nozzle before the component mounting can be performed by imaging the nozzle which is stopping at the precedent position. Further, while one nozzle performs the component mounting at the working position, a nozzle which has finished the component mounting at the working position precedently stops at the subsequent position. For this reason, the imaging of the nozzle after the component mounting can be performed by imaging the nozzle which is stopping at the subsequent position.

The change of the nozzle positioned at the working position can be performed as appropriate by various methods other than the above-described method of intermittently rotating a plurality of nozzles in a constant direction by one pitch, and for example, a nozzle away from one nozzle positioned at the working position by two pitches or more can be positioned next to the working position. When the nozzle positioned at the working position is changed thus, however, before the next nozzle is moved to the working position, an operation of temporarily stopping this nozzle at the precedent position and another operation of temporarily stopping one nozzle which has finished the component mounting at the subsequent position are wastefully caused for the imaging of the nozzles. Therefore, depending on the method of changing the nozzle positioned at the working position, there is a possibility that the imaging of the nozzle cannot be efficiently performed.

The present disclosure is intended to solve the above problem, and to provide a technique for efficiently performing imaging of a nozzle, regardless of a method of changing a nozzle positioned at a working position.

A component mounter according to the present disclosure comprises a mounting head configured to rotate a plurality of nozzles arranged at intervals of at least minimum center-to-center distance along a circumferential orbit centering around a predetermined rotation axis integrally, and cause the nozzle to perform at least one operation of holding and mounting of a component by moving the nozzle up and down at a predetermined working position provided on the circumferential orbit; and an imaging part configured to include the circumferential orbit in an imaging view, wherein the mounting head changes the nozzle positioned at the working position by rotating the plurality of nozzles integrally, and the imaging part images the nozzle which is moving within a predetermined range having a width smaller than twice the minimum center-to-center distance with the working position as the center along the circumferential orbit.

Also, a nozzle imaging method, according to the present disclosure comprises rotating a plurality of nozzles of a mounting head integrally to thereby change the nozzle positioned at a predetermined working position provided on a circumferential orbit centering around a predetermined rotation axis, the mounting head having the plurality of nozzles arranged at intervals of at least minimum center-to-center distance along the circumferential orbit and causing the nozzle to perform at least one operation of holding and mounting of a component by moving the nozzle up and down at the working position; and imaging the nozzle which is moving within a predetermined range having a width smaller than twice the minimum center-to-center distance with the working position as the center along the circumferential orbit.

In the present disclosure (component mounter, nozzle imaging method) having such a configuration, the nozzle positioned at the working position is changed by integrally rotating the plurality of nozzles arranged at intervals of at least minimum center-to-center distance along the circumferential orbit centering around the predetermined rotation axis. At that time, regardless of the method of changing the nozzle positioned at the working position, the nozzle moving to (approaching) the working position and the nozzle moving (going away) from the working position move within the predetermined range having a width smaller than twice the minimum center-to-center distance with the working position as the center along the circumferential orbit. Then, in the present disclosure, the nozzle which is moving within the predetermined range is imaged. In the present disclosure described above, it is not necessary to temporarily stop the nozzle wastefully for the imaging, and as a result, regardless of the method of changing the nozzle positioned at the working position, it is possible to efficiently perform the imaging of the nozzle.

According to the present disclosure, it becomes possible to efficiently perform the imaging of the nozzle, regardless of the method of changing the nozzle positioned at the working position.

DETAILED DESCRIPTION

Figure 1:
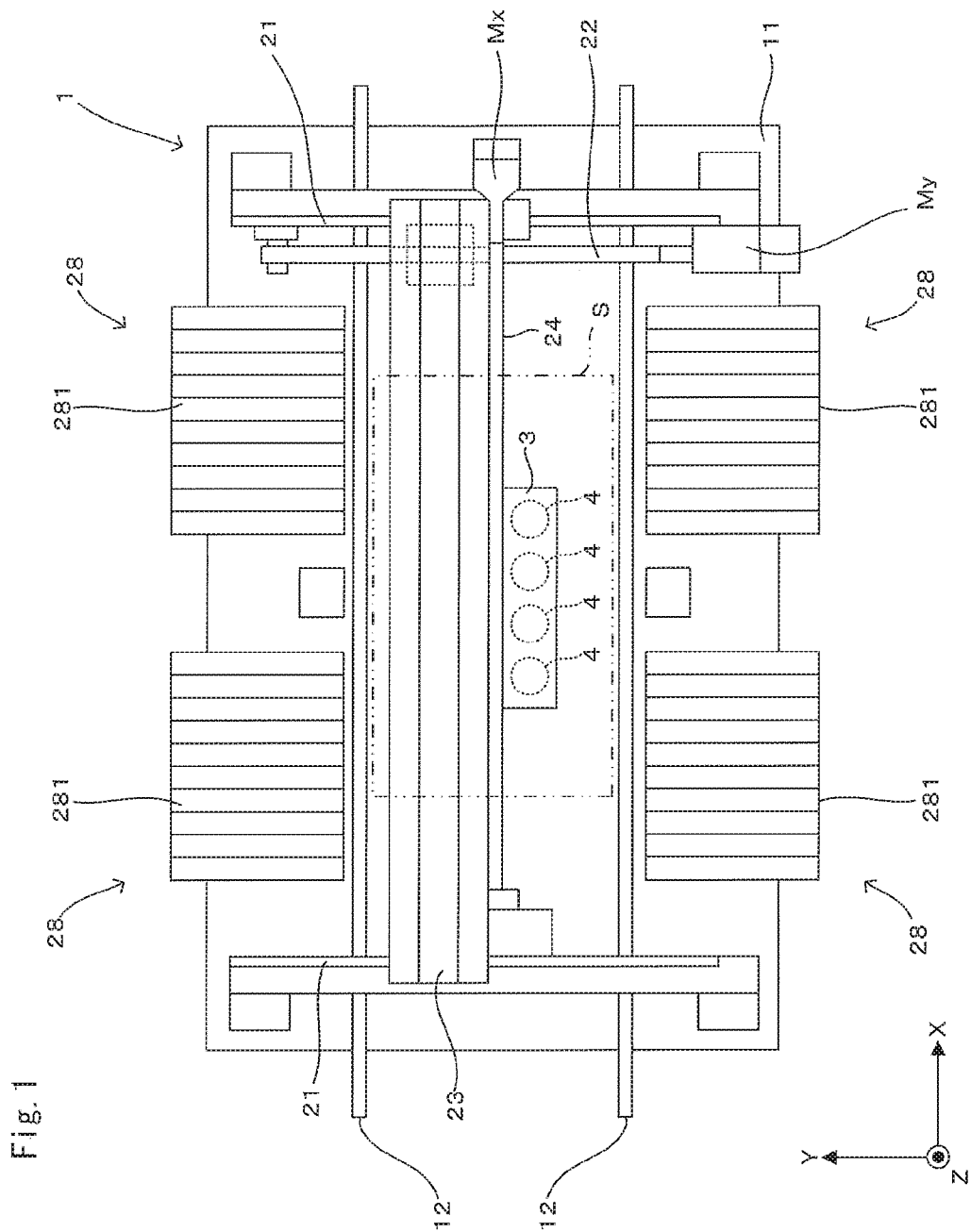
FIG. 1 is a partial plan view schematically showing a component mounter in accordance with a present disclosure.
Figure 2:
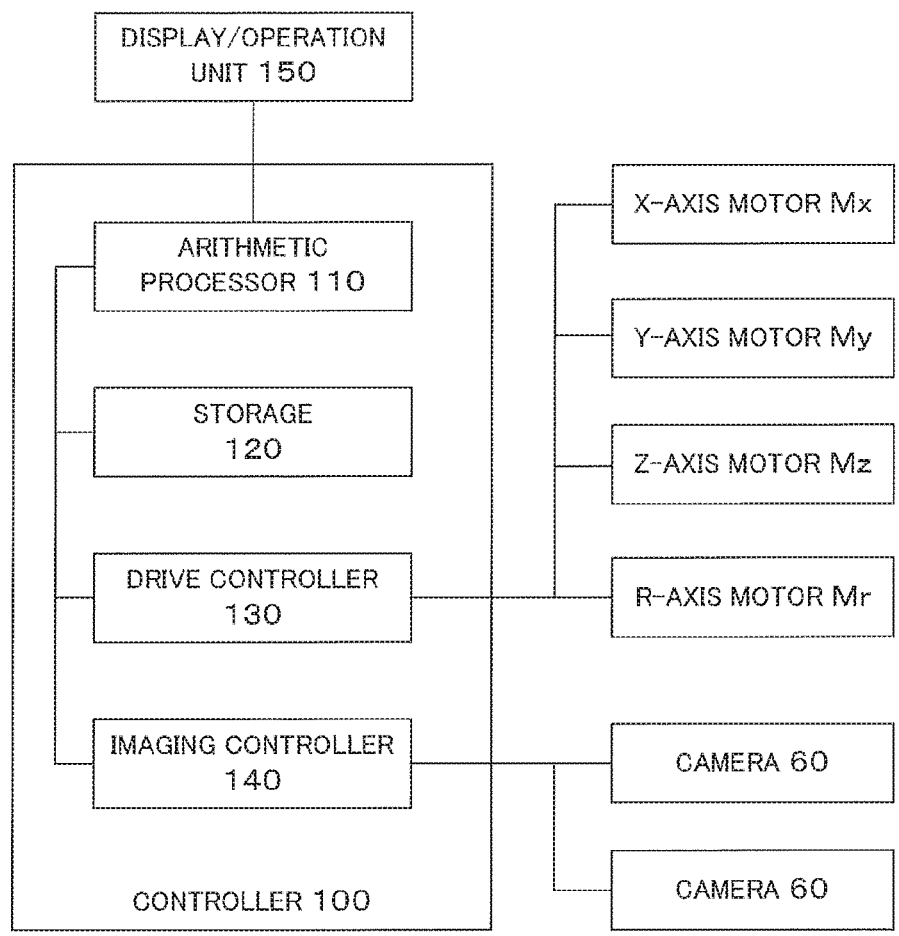
FIG. 2 is a block diagram showing an electrical structure provided in the component mounter of FIG. 1.

FIG. 1 is a partial plan view schematically showing a component mounter in accordance with a present disclosure. FIG. 2 is a block diagram showing an electrical structure provided in the component mounter of FIG. 1. In FIGS. 1 and 2 and the following figures, a XYZ rectangular coordinate system with a Z direction as a vertical direction is shown as appropriate. As shown in FIG. 2, the component mounter 1 includes a controller 100 configured to generally control the whole apparatus. The controller 100 has an arithmetic processor 110 which is a computer constituted of a CPU (Central Processing Unit) and a RAM (Random Access Memory) and a storage 120 which is formed of a HDD (Hard Disk Drive). The controller 100 further has a drive controller 130 configured to control a drive system of the component mounter 1 and an imaging controller 140 configured to control imaging of a nozzle described later.

Then, the arithmetic processor 110 controls the drive controller 130 in accordance with a program stored in the storage 120, to thereby perform component mounting prescribed by the program. At that time, the arithmetic processor 110 controls the component mounting on the basis of an image which is imaged by the imaging controller 140 by using a camera 60. Further, the component mounter 1 is provided with a display/operation unit 150, and the arithmetic processor 110 displays a state of the component mounter 1 on the display/operation unit 150 and receives an instruction of an operator which is inputted to the display/operation unit 150.

As shown in FIG. 1, the component mounter 1 includes a pair of conveyors 12 and 12 provided on a base 11. Then, the component mounter 1 mounts components on a board S conveyed by the conveyor 12 into a mounting position (the position of the board S in FIG. 1) from the upstream in an X direction (board conveying direction) and conveys the board S on which the component mounting is completed, by the conveyor 12 from the mounting position to the downstream in the X direction.

The component mounter 1 is provided with a pair of Y-axis rails 21 and 21 extending in a Y direction, a Y-axis ball screw 22 extending in the Y direction, and a Y-axis motor My which rotationally drives the Y-axis ball screw 22, and a head support member 23 is fixed to a nut of the Y-axis ball screw 22, being supported by the pair of Y-axis rails 21 and 21 movably in the Y direction. To the head support member 23, attached are an X-axis ball screw 24 extending in the X direction and an X-axis motor Mx which rotationally drives the X-axis ball screw 24, and a head unit 3 is fixed to a nut of the X-axis ball screw 24, being supported by the head support member 23 movably in the X direction. Therefore, the drive controller 130 can rotate the Y-axis ball screw 22 by using the Y-axis motor My to move the head unit 3 in the Y direction or rotates the X-axis ball screw 24 by using the X-axis motor Mx to move the head unit 3 in the X direction.

On each of both sides of the pair of conveyors 12 and 12 in the Y direction, two component supply parts 28 are aligned in the X direction. To each of the component supply parts 28, a plurality of tape feeders 281 are attached in a detachable/attachable manner, being aligned in the X direction, and to each of the tape feeders 281, disposed is a reel wound with a tape in which chip-like components (chip electronic components) such as an integrated circuit, a transistor, a capacitor, and the like are accommodated at predetermined pitches. Then, the tape feeder 281 intermittently discharges the tape to the head unit 3 side, to thereby supply the components inside the tape.

The head unit 3 has a plurality of (four) mounting heads 4 aligned linearly in the X direction. Each of the mounting heads 4 adsorbs and mounts the components by using a nozzle 40 (FIG. 3) attached to the lower end thereof. In other words, the mounting head 4 moves to above the tape feeder 281 and adsorbs the component supplied by the tape feeder 281. Specifically, the mounting head 4 moves the nozzle 40 down to come into contact with the component and then moves the nozzle 40 up while generating a negative pressure inside the nozzle 40, to thereby adsorb the component. Subsequently, the mounting head 4 moves to above the board S at the mounting position, to mount the component on the board S. Specifically, the mounting head 4 moves the nozzle 40 down until the component comes into contact with the board S and then generates an atmosphere pressure or a positive pressure inside the nozzle 40, to thereby mount the component.

Figure 3:
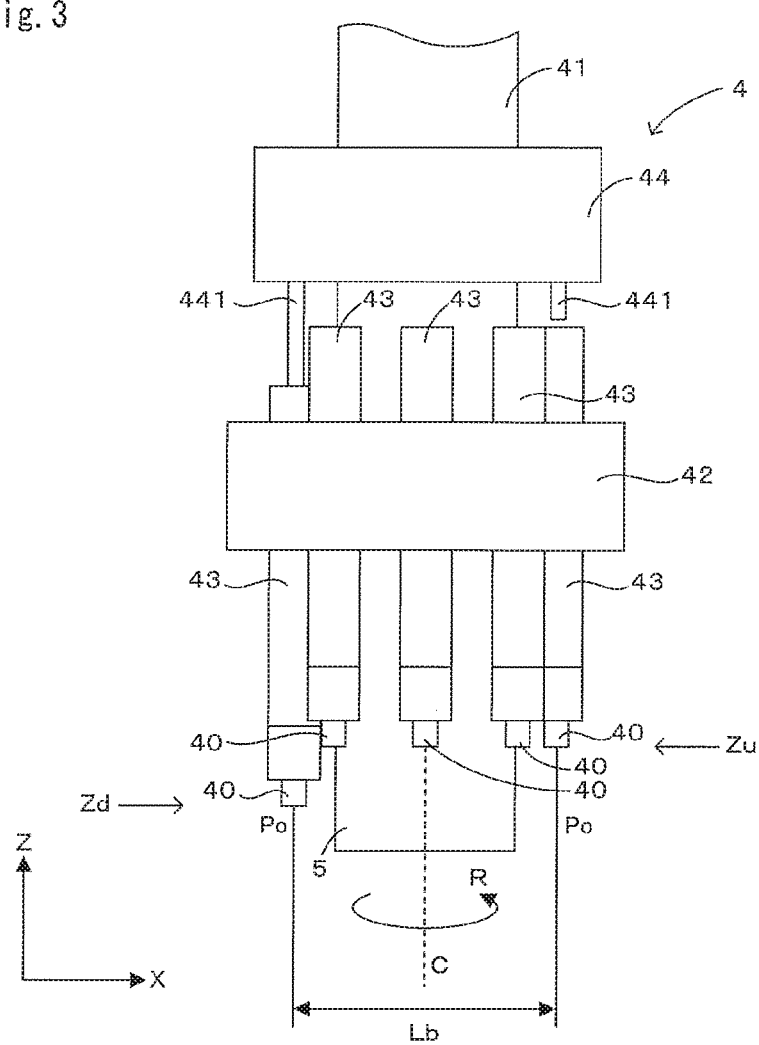
FIG. 3 is a partial elevational view schematically showing the vicinity of a lower end of an exemplary mounting head
Figure 4:
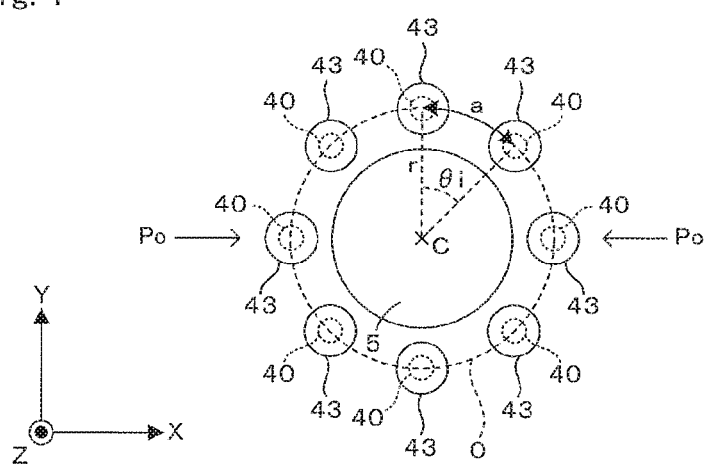
FIG. 4 is a partial plan view schematically showing a bottom of the mounting head of FIG. 3.

FIG. 3 is a partial elevational view schematically showing the vicinity of a lower end of an exemplary mounting head. FIG. 4 is a partial plan view schematically showing a bottom of the mounting head of FIG. 3. As shown in FIGS. 3 and 4, each mounting head 4 is a rotary head in which a plurality of nozzles 40 are circumferentially arranged. Subsequently, structure of the mounting head 4 will be described, with reference to FIGS. 3 and 4. Since the four mounting heads 4 have the same structure, description will be made on one mounting head 4 herein.

The mounting head 4 has a main shaft 41 extending in the Z direction (vertical direction) and a nozzle holder 42 supported at a lower end of the main shaft 41. The nozzle holder 42 is supported so as to be rotatable in a rotation direction R about a rotation axis C (virtual axis) in parallel with the Z direction and rotated by receiving a driving force of an R-axis motor Mr (FIG. 2) provided at an upper end of the mounting head 4. Further, the nozzle holder 42 supports a plurality of (eight) lifting shafts 43 arranged circumferentially centering around the rotation axis C at intervals of equal angle θ1.

Each lifting shaft 43 is supported so as to be movable upward and downward and is biased upwardly by a biasing member not shown in the drawings. To a lower end of each lifting shaft 43, the nozzle 40 is attached in a detachable/attachable manner. The nozzle holder 42 thereby supports the plurality of nozzles 40 arranged circumferentially centering around the rotation axis C at intervals of equal angle θ1. Therefore, when the drive controller 130 output a rotation command to the R-axis motor Mr, accompanying the nozzle holder 42 which is rotated by receiving the driving force of the R-axis motor Mr, the plurality of nozzles 40 are integrally rotated along a circumferential orbit O about the rotation axis C.

Thus, in the mounting head 4, the eight nozzles 40 are arranged centering around the rotation axis C at intervals of equal rotation angle θ1, and in other words, the eight nozzles 40 are arranged along the circumferential orbit O away from one another at intervals of equal center-to-center distance a. Herein, the center of the nozzle 40 is represented, for example, by a vertical line passing through the geometric center of an opening through which the nozzle 40 adsorbs the component in a bottom view. Further, in order to adjust the rotation angle of the component to be adsorbed, the nozzle 40 is generally rotatable. Therefore, the center of the nozzle 40 is represented by a rotation center line of the nozzle 40, instead of the vertical line passing through the geometric center of the opening. Then, the center-to-center distance a is represented by a distance along the circumferential orbit O between the respective centers of the two adjacent nozzles 40, which corresponds to the length of an arc having a radius r (the radius of the circumferential orbit O) from the rotation axis C to the nozzle 40, with the angle θ1 as a central angle.

Further, the main shaft 41 supports a nozzle lifting mechanism 44 above the plurality of lifting shafts 43. The nozzle lifting mechanism 44 has two pressing members 441 arranged around the rotation axis C at an interval of angle of 180 degrees. Each of the pressing members 441 is independently lifted and lowered by receiving a driving force of a Z-axis motor Mz (FIG. 2) incorporated in the nozzle lifting mechanism 44. Therefore, when the drive controller 130 outputs a lowering command to the Z-axis motor Mz, the pressing member 441 is lowered by receiving the driving force of the Z-axis motor Mz. The pressing member 441 thereby lowers one lifting shaft 43 which is positioned right therebelow, out of the plurality of lifting shafts 43, against the biasing force acting on the lifting shaft 43, to lower the nozzle 40 to a lowered position Zd at which the component is adsorbed or mounted. On the other hand, when the drive controller 130 outputs a lifting command to the Z-axis motor Mz, the pressing member 441 is lifted by receiving the driving force of the Z-axis motor Mz. The one lifting shaft 43 which is pressed by the pressing member 441 is thereby lifted in accordance with the biasing force with being accompanied by the nozzle 40 and the nozzle 40 is lifted to a lifted position Zu. In FIG. 3, shown are the lowered position Zd and the lifted position Zu for the lower end of the nozzle 40.

In the mounting head 4 described above, a position right below the pressing member 441 serves as a working position Po at which the nozzle 40 adsorbs and mounts the component. In other words, corresponding to the arrangement of the above-described two pressing members 441, in the mounting head 4, two working positions Po and Po are provided around the rotation axis C at an interval of angle of 180 degrees. On the other hand, in the nozzle holder 42, as shown in FIG. 4, four pairs (nozzle pairs) of two nozzles 40 which are arranged around the rotation axis C at an interval of angle of 180 degrees (two nozzles 40 positioned on opposite sides with respect to the rotation axis C interposed therebetween) are provided and 2×4 (=8) nozzles 40 are arranged along the circumferential orbit O. The pair of two nozzles 40 satisfies an arrangement relation in which at the same time when one nozzle 40 is located at one working position Po, the other nozzle 40 can be located at the other working position Po. Therefore, by using the R-axis motor Mr to adjust the rotation angle of the plurality of nozzles 40, the drive controller 130 can position the two nozzles 40 constituting arbitrary one nozzle pair, out of the four nozzle pairs, at the respective working positions Po and Po, to be used for adsorbing and mounting the components.

In order to adsorb the component at the working position Po, for example, the mounting head 4 is moved to above the component supply part 28 and the working position Po is located right above the tape feeder 281. In this state, the nozzle 40 which has not adsorbed any component is lowered from the lifted position Zu to the lowered position Zd in the Z direction while being stopped at the working position Po in the rotation direction R. Then, at a timing when the nozzle 40 comes into contact with the component which is supplied by the tape feeder 281, the negative pressure is given to the nozzle 40 and the nozzle 40 thereby adsorbs the component from the tape feeder 281. Subsequently, the nozzle 40 which has adsorbed the component is lifted from the lowered position Zd to the lifted position Zu in the Z direction.

Alternatively, in order to mount the component at the working position Po, the mounting head 4 is moved to above the board S and the working position Po is located right above a mounting target portion on the board S. In this state, the nozzle 40 which has adsorbed the component is lowered from the lifted position Zu to the lowered position Zd in the Z direction while being stopped at the working position Po in the rotation direction R. Then, at a timing when the component comes into contact with the board S, the atmosphere pressure or the positive pressure is given to the nozzle 40 and the nozzle 40 thereby mounts the component on the board S. Subsequently, the nozzle 40 which has released the component is lifted from the lowered position Zd to the lifted position Zu in the Z direction.

Further, to the lower end of the main shaft 41 of the mounting head 4, a cylindrical light diffusion member 5 is attached and the plurality of nozzles 40 are arranged, surrounding the light diffusion member 5. The light diffusion member 5 has the same structure as that of a diffusion member disclosed in, for example, Japanese Patent Application No. 2012-238726 and is used for imaging a side view of the nozzle 40, which is performed by an imaging unit 6 (FIGS. 5 and 6) described later.

Figure 5:
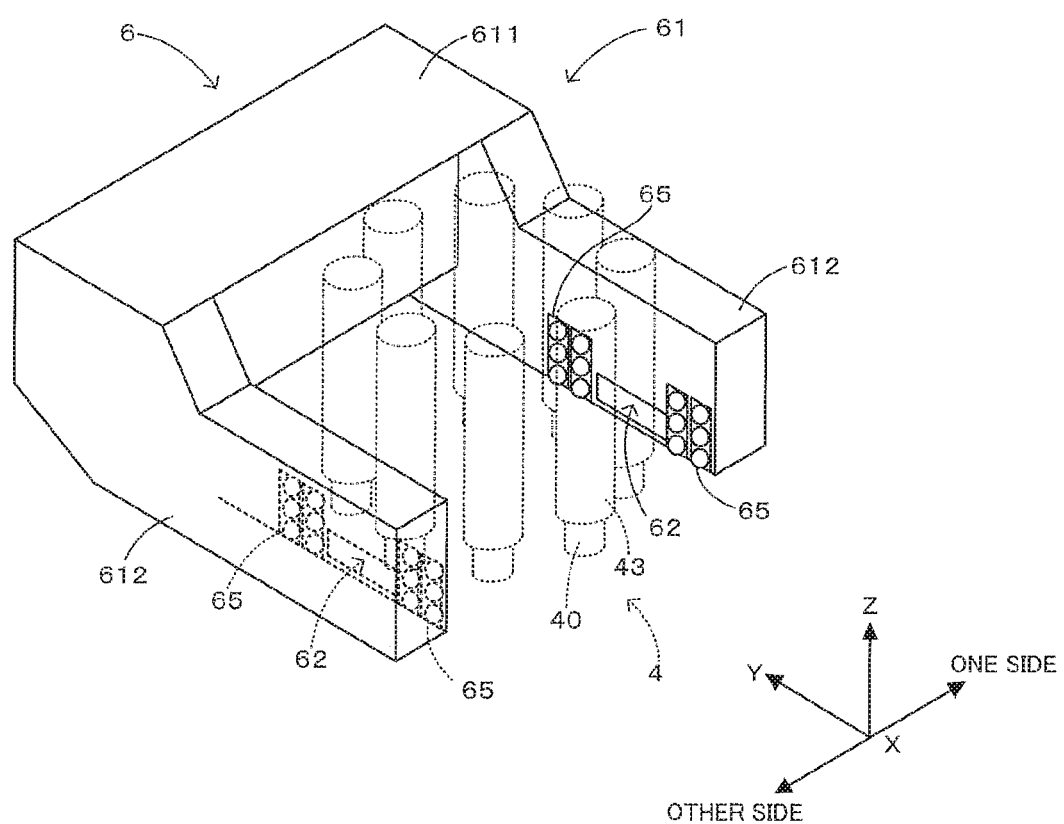
FIG. 5 is a partial perspective view schematically showing an appearance of the imaging unit.

In other words, in the component mounter 1, the side view of the nozzle 40 (the side surface of the nozzle 40 viewed from the X direction) which is moving at the height of the lifted position Zu in the Z direction and passing a position before or after the working position Po in the rotation direction R is imaged by the camera 60 of the imaging unit 6 (FIG. 5). Subsequently, structure of the imaging unit 6 will be described, with reference to FIG. 5.

FIG. 5 is a partial perspective view schematically showing an appearance of the imaging unit. In FIG. 5, for illustrating a relation with the mounting head 4, the structure of the mounting head 4 is partially shown. A housing 61 provided in the imaging unit 6 has a main body part 611 extending in the X direction and two nozzle facing parts 612 protruding in the Y direction from both ends of the main body part 611 in the X direction, and each of the nozzle facing parts 612 incorporates the camera 60 (FIG. 2). Then, the imaging unit 6 has an arrangement in which the two nozzle facing parts 612 sandwich the plurality of nozzles 40 from the X direction, and is fixed to the main shaft 41 of the mounting head 4. Thus, the imaging unit 6 is formed integrally with the mounting head 4 and movable accompanying the mounting head 4.

In an inner wall of each nozzle facing part 612, provided is a window 62 facing the working position Po of the mounting head 4 in the X direction. Then, each camera 60 faces the working position Po through the window 62 in the X direction and images an image of the vicinity of the working position Po from the X direction. Further, as described above, with moving up and down of the pressing member 441, the nozzle 40 is moved up and down between the lifted position Zu and the lowered position Zd. By contrast with this, each window 62 is provided at the height of the lifted position Zu, and each camera 60 images an image of the vicinity of the working position Po at the lifted position Zu from the X direction (horizontal direction).

Further, on the inner wall of each nozzle facing part 612, provided is a lighting 65. Each lighting 65 is constituted of a plurality of LEDs (Light Emitting Diodes) arranged in a matrix on both sides of the window 62 and emits light toward the working position Po. Thus, the lighting 65 is provided for each window 62 so that the lighting 65 and the window 62 sandwich the mounting head 4 and light diffusion member 5 and face each other, and each camera 60 images a silhouette image of the working position Po illuminated from a back side, with the light emitted from the lighting 65 and diffused by the light diffusion member 5.

As described later, this component mounter 1 images the side view of the nozzle 40 (the side surface of the nozzle 40 viewed from the X direction) passing imaging positions provided before and after the working position Po in the rotation direction R. Then, the arithmetic processor 110 controls adsorption and mounting of the component by the nozzle 40 on the basis of a side view image of the nozzle 40, for example, in the following manner.

In adsorbing the component, the side view of the nozzle 40 positioned at the lifted position Zu is imaged at respective timings before and after the adsorption of the component. Then, when extraneous matter is adhered to the nozzle 40 in the side view image imaged before the component adsorption, the component adsorption is stopped. Further, when there is no component at the lower end of the nozzle 40 in the side view image imaged after the nozzle 40 is lowered to the lowered position Zd for the component adsorption, it is determined that the component adsorption has failed, and the component adsorption is retried. Further, the thickness and posture of the component adsorbed by the nozzle 40 is determined as appropriate on the basis of the side view image of the nozzle 40.

In mounting the component, the side view of the nozzle 40 positioned at the lifted position Zu is imaged at respective timings before and after the mounting of the component. Then, when there is no component at the lower end of the nozzle 40 in the side view image imaged before mounting the component, it is determined that the component has fallen out from the nozzle 40, and the component mounting is stopped. Further, when the component remains at the lower end of the nozzle 40 in the side view image imaged after the nozzle 40 is lowered to the lowered position Zd for the component mounting, it is determined that the component mounting has failed, and the component mounting is retried.

Subsequently, a specific example of a side view imaging behavior to the nozzle 40 performed by the imaging unit 6 will be described. Since the two cameras 60 included in the imaging unit 6 perform similar imaging behaviors, description will be made on the imaging behavior performed by one camera 60 herein. Further, the camera 60 images an image of the nozzle 40 at the time when at least one of the component adsorption and the component mounting is performed. Since similar imaging behaviors are performed in the component adsorption and the component mounting, however, description will be made basically without distinguishing the operation content and as necessary, the specific operation content will be explicitly indicated.

Figure 6:
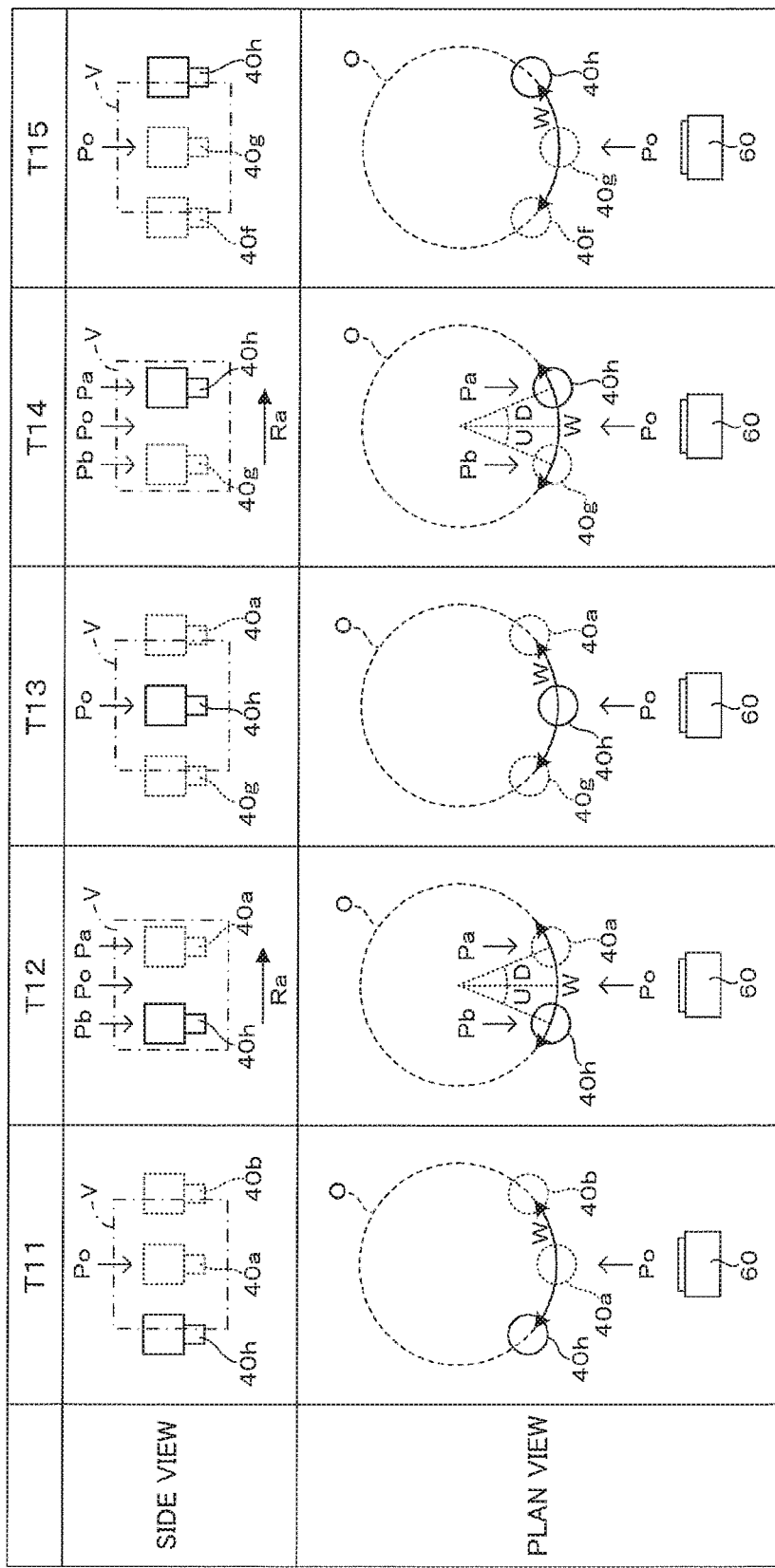
FIG. 6 is a view schematically showing a first example of the side view imaging behavior to the nozzle.

FIG. 6 is a view schematically showing a first example of the side view imaging behavior to the nozzle. FIG. 6 shows an exemplary case where while the nozzle 40 positioned at the working position Po is changed by intermittently rotating the plurality of nozzles 40 counterclockwise by the center-to-center distance a, the operation is performed by the nozzle 40 positioned at the working position Po. In FIG. 6, respective operations at times T11 to T15 are shown in chronological order, and particularly, the nozzle 40 viewed from the X direction is partially shown in the column of "side view" and the nozzle 40 viewed from the upper side in the Z direction is partially shown in the column of "plan view". Further, for distinguishing the eight nozzles 40, lowercase alphabet letters "a" to "h" are given to the eight nozzles 40 in a clockwise order, and the nozzle 40 to be imaged is represented by a solid line and the other nozzles 40 are represented by broken lines. The nozzles 40 not to be imaged, however, are partially shown.

As shown in FIG. 6, an imaging view V of the camera 60 includes the working position Po on the circumferential orbit O and the nozzle 40 which is moving in a predetermined imaging target range W can be imaged. The imaging target range W has a width smaller than twice the center-to-center distance a with the working position Po as the center along the circumferential orbit O. Further, the imaging controller 140 configured to control the camera 60 sets a before-operation imaging position Pb and an after-operation imaging position Pa within the imaging target range W. Specifically, in the rotation direction Ra of the nozzle 40 which is intermittently rotated counterclockwise, the before-operation imaging position Pb is set on the upstream side of the working position Po and the after-operation imaging position Pa is set on the downstream side of the before-operation imaging position Pb.

At that time, in the imaging view V of the camera 60, the light diffusion member 5 is so extended in the rotation direction R as to overlap both the before-operation imaging position Pb and the after-operation imaging position Pa from the back side, and the light emitted from the lighting 65 and diffused by the light diffusion member 5 illuminates the before-operation imaging position Pb and the after-operation imaging position Pa from the back side (in other words, the opposite side of the camera 60). Therefore, the camera 60 can image the silhouette image of the nozzle 40 which is passing the before-operation imaging position Pb and the after-operation imaging position Pa.

At that time, when the controller 100 detects, on the basis of an encoder signal or the like of the R-axis motor Mr, that the nozzle 40 to be imaged has reached a predetermined position (for example, the before-operation imaging position Pb or the after-operation imaging position Pa) or immediately before the nozzle 40 reaches the predetermined position, the controller 100 outputs an imaging command to the camera 60 and the lighting 65. Receiving the imaging command, the camera 60 starts exposure and the lighting 65 starts emission of the light. Further, in order to prevent an imaged image from being blurred due to imaging of the nozzle 40 which is moving, the imaging of the nozzle 40 is performed instantaneously. Specifically, while setting an exposure time of the camera 60 as a moment, a lighting time of the lighting 65 is also set to a moment in conformity with the exposure time of the camera 60.

At the timing T11, a nozzle 40a performs an operation at the working position Po. In this while, a nozzle 40h which will perform an operation next stops at a position on the upstream side of the working position Po by the center-to-center distance a in a rotation direction Ra and is adjacent to the nozzle 40a positioned at the working position Po. When the operation of the nozzle 40a is completed at the working position Po, the eight nozzles 40a to 40h start rotating in the rotation direction Ra.

Then, the camera 60 starts working in conformity with the timing T12 when the nozzle 40h reaches the before-operation imaging position Pb, and the nozzle 40h which is passing the before-operation imaging position Pb is imaged by the camera 60. The imaging controller 140 stores image data of the nozzle 40 which are obtained thus into the storage 120, being associated with an identifier indicating the before-operation imaging position Pb.

At the timing T13, when the nozzle 40h reaches the working position Po, the eight nozzles 40a to 40h stop the rotation in the rotation direction Ra. Thus, the eight nozzles 40a to 40h intermittently rotate by the center-to-center distance a in the rotation direction Ra, and the nozzle 40 positioned at the working position Po is changed from the nozzle 40a to the nozzle 40h adjacent to the nozzle 40a and the nozzle 40h performs an operation at the working position Po. When the operation of the nozzle 40h is completed at the working position Po, the eight nozzles 40a to 40h start rotating in the rotation direction Ra.

Then, the camera 60 starts working in conformity with the timing T14 when the nozzle 40h reaches the after-operation imaging position Pa, and the nozzle 40h which is passing the after-operation imaging position Pa is imaged by the camera 60. The imaging controller 140 stores image data of the nozzle 40 which are obtained thus into the storage 120, being associated with an identifier indicating the after-operation imaging position Pa.

At the timing T15, when a nozzle 40g reaches the working position Po, the eight nozzles 40a to 40h stop the rotation in the rotation direction Ra. Thus, the eight nozzles 40a to 40h intermittently rotate by the center-to-center distance a in the rotation direction Ra, and the nozzle 40 positioned at the working position Po is changed from the nozzle 40h to the nozzle 40g adjacent to the nozzle 40h and the nozzle 40g performs an operation at the working position Po.

By repeating the above behavior, each of the eight nozzles 40a to 40h performs an operation in turn at the working position Po. In other words, the mounting head 4 causes one of the eight nozzles 40a to 40h to be positioned at the working position Po and perform an operation, and subsequently, the mounting head 4 causes the next nozzle 40 adjacent to the one nozzle 40 in the circumferential orbit O to be positioned at the working position Po and perform an operation.

Then, for each of the executions of component adsorption and component mounting, the imaging behavior shown in FIG. 6 is performed. Particularly, by imaging the nozzle 40 which is moving to the working position Po for the component mounting, it is possible to check the error that the component falls out from the working position Po due to the inertial force which is acting when the nozzle 40 starts moving to the working position Po for the component mounting.

Further, whether the component mounting at the working position Po succeeds or fails is determined by checking whether or not the component is adhered to the nozzle 40 which has performed the component mounting at the working position Po, on the basis of the imaged image of the nozzle 40. In the configuration in which the nozzle 40 is imaged after the nozzle 40 which has performed the component mounting at the working position Po is stopped, however, even if the component mounting at the working position Po fails and the component is adhered to the nozzle 40, for example, when the component falls out from the nozzle 40 immediately before the nozzle 40 is stopped, or the like, it is wrongly determined that the component mounting succeeds and therefore the reliability of determination on success or failure of the component mounting is low. On the other hand, in the above example, the nozzle 40 which has performed the component mounting at the working position Po is imaged at the after-operation imaging position Pa before being stopped at the next stop position. For this reason, by checking whether or not there is a component adhered to the nozzle 40 in the image imaged at the after-operation imaging position Pa, the determination on success or failure of the component mounting can be performed with relatively high reliability.

Furthermore, the determination on success or failure of the component adsorption at the working position Po is performed by checking whether or not there is a component adsorbed by the nozzle 40 which has performed the component adsorption at the working position Po, on the basis of the imaged image of the nozzle 40. At that time, in the configuration in which the nozzle 40 is imaged after the nozzle 40 which has performed the component adsorption at the working position Po is stopped, even if the component adsorption at the working position Po succeeds, for example, when the component falls out from the nozzle 40 immediately before the nozzle 40 is stopped, or the like, it is wrongly determined that the component adsorption fails. For this reason, it is difficult to determine whether the cause of there being no component adsorbed by the nozzle 40 in the imaged image lies in failure of the component adsorption or falling-out of the component from the nozzle 40 which is moving. On the other hand, in the above example, the nozzle 40 which has performed the component adsorption at the working position Po is imaged at the after-operation imaging position Pa before being stopped at the next stop position. For this reason, by checking whether or not there is a component adsorbed by the nozzle 40 in the image imaged at the after-operation imaging position Pa, the determination on success or failure of the component adsorption can be performed with relatively high accuracy.

Setting of the before-operation imaging position Pb and the after-operation imaging position Pa depends on which of the component adsorption and the component mounting is to be performed. Specifically, for performing the component adsorption, the angle U of the before-operation imaging position Pb to the working position Po with the rotation axis C as the center is equal to the angle D of the after-operation imaging position Pa to the working position Po with the rotation axis C as the center, and in the other words, the distance between the before-operation imaging position Pb and the working position Po is equal to the distance between the after-operation imaging position Pa and the working position Po.

On the other hand, for performing the component mounting, the angle U of the before-operation imaging position Pb to the working position Po with the rotation axis C as the center is larger than the angle D of the after-operation imaging position Pa to the working position Po with the rotation axis C as the center, and in the other words, the distance between the before-operation imaging position Pb and the working position Po is larger than the distance between the after-operation imaging position Pa and the working position Po. In such a configuration, since the distance between the before-operation imaging position Pb and the working position Po is set long, it is possible to ensure the time period required until the nozzle 40, which is confirmed by the imaging at the before-operation imaging position Pb that the component falls out from, reaches the working position Po. As a result, it becomes possible for the arithmetic processor 110 to perform control to complete a process necessary to stop the component mounting during the ensured time period and prevent the nozzle 40 holding no component from moving down at the working position Po to come into contact with the board S.

Further, in the exemplary case of FIG. 6, by intermittently rotating the eight nozzles 40 in a constant direction by the center-to-center distance a, the nozzle 40 to be positioned at the working position Po is changed. Further, in the case of component adsorption, the before-operation imaging position Pb and the after-operation imaging position Pa are set to be away from the working position Po by the same distance. For this reason, the timing when one nozzle 40 which has completed the adsorption at the working position Po passes the after-operation imaging position Pa is equal to the timing when the next nozzle 40 which is to perform the next adsorption at the working position Po passes the before-operation imaging position Pb, and at the timing T14 of FIG. 6, for example, the nozzle 40h passes the after-operation imaging position Pa at the same time when the nozzle 40g passes the before-operation imaging position Pb. Then, the camera 60 images, at the same time, the two nozzles 40 which pass the before-operation imaging position Pb and the after-operation imaging position Pa, respectively, at the same time, to thereby efficiently image the nozzles 40.

Figure 7:
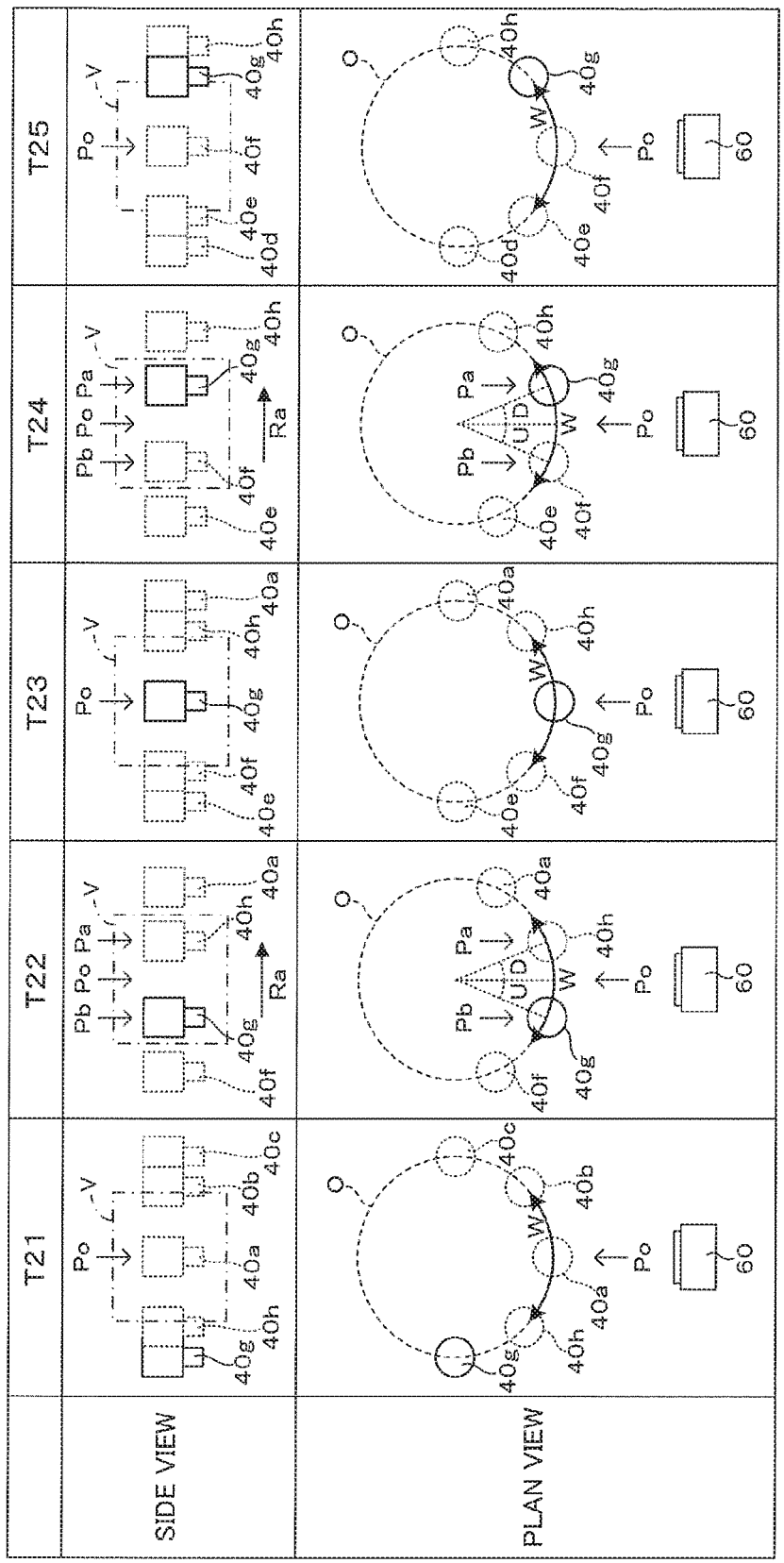
FIG. 7 is a view schematically showing a second example of the side view imaging behavior to the nozzle.

FIG. 7 is a view schematically showing a second example of the side view imaging behavior to the nozzle. FIG. 7 shows an exemplary case where while the nozzle 40 positioned at the working position Po is changed in the order of 40a, 40g, and 40f by intermittently rotating the plurality of nozzles 40 counterclockwise by twice the center-to-center distance a and then intermittently rotating the plurality of nozzles 40 counterclockwise by the center-to-center distance a, the operations are performed by these nozzles 40a, 40g, and 40f. Herein, description will be made, centering on the difference between the first example shown in FIG. 6 and the second example shown in FIG. 7, and description of common points of the first and second examples will be omitted as appropriate. The notation of FIG. 7 is the same as that of FIG. 6.

At the timing T21, the nozzle 40a performs an operation at the working position Po. In this while, the nozzle 40g which will perform an operation next stops at a position on the upstream side of the working position Po by twice the center-to-center distance a in the rotation direction Ra. When the operation of the nozzle 40a is completed at the working position Po, the eight nozzles 40a to 40h start rotating in the rotation direction Ra.

Then, the camera 60 starts working in conformity with the timing T22 when the nozzle 40g reaches the before-operation imaging position Pb, and the nozzle 40g which is passing the before-operation imaging position Pb is imaged by the camera 60. The imaging controller 140 stores image data of the nozzle 40 which are obtained thus into the storage 120, being associated with the identifier indicating the before-operation imaging position Pb.

At the timing T23, when the nozzle 40g reaches the working position Po, the eight nozzles 40a to 40h stop the rotation in the rotation direction Ra. Thus, the eight nozzles 40a to 40h intermittently rotate by twice the center-to-center distance a in the rotation direction Ra, and the nozzle 40 positioned at the working position Po is changed from the nozzle 40a to the nozzle 40g and the nozzle 40g performs an operation at the working position Po. When the operation of the nozzle 40g is completed at the working position Po, the eight nozzles 40a to 40h start rotating in the rotation direction Ra.

Then, the camera 60 starts working in conformity with the timing T24 when the nozzle 40g reaches the after-operation imaging position Pa, and the nozzle 40g which is passing the after-operation imaging position Pa is imaged by the camera 60. The imaging controller 140 stores image data of the nozzle 40 which are obtained thus into the storage 120, being associated with the identifier indicating the after-operation imaging position Pa.

At the timing T25, when a nozzle 40f reaches the working position Po, the eight nozzles 40a to 40h stop the rotation in the rotation direction Ra. Thus, the eight nozzles 40a to 40h intermittently rotate by the center-to-center distance a in the rotation direction Ra, and the nozzle 40 positioned at the working position Po is changed from the nozzle 40g to the nozzle 40f and the nozzle 40f performs an operation at the working position Po.

Herein, description has been made, paying attention to the imaging of the nozzle 40g. During the intermittent rotation performed from the timing T21 to the timing T23, however, the nozzle 40a which has performed the operation at the working position Po at the timing T21 passes the after-operation imaging position Pa. Then, the camera 60 also images the nozzle 40a which has completed the operation and is passing the after-operation imaging position Pa. Specifically, during the intermittent rotation performed in order to move the nozzle 40g which is to perform the operation next at the working position Po to the working position Po, performed are the imaging of the nozzle 40g at the before-operation imaging position Pb and the imaging of the nozzle 40a at the after-operation imaging position Pa. Thus, during one intermittent rotation, the nozzle 40 before the operation and the nozzle 40 after the operation can be imaged.

Then, for each of the executions of component adsorption and component mounting, the imaging behavior shown in FIG. 7 is performed. Like in the first example of FIG. 6, also in the second example of FIG. 7, setting of the before-operation imaging position Pb and the after-operation imaging position Pa depends on which of the component adsorption and the component mounting is to be performed. By setting the distance between the before-operation imaging position Pb and the working position Po long, it is possible to ensure the time period required until the nozzle 40, which is confirmed by the imaging at the before-operation imaging position Pb that the component falls out from, reaches the working position Po. As a result, it becomes possible for the arithmetic processor 110 to perform control to complete a process necessary to stop the component mounting during the ensured time period and prevent the nozzle 40 holding no component from moving down at the working position Po to come into contact with the board S.

Figure 8:
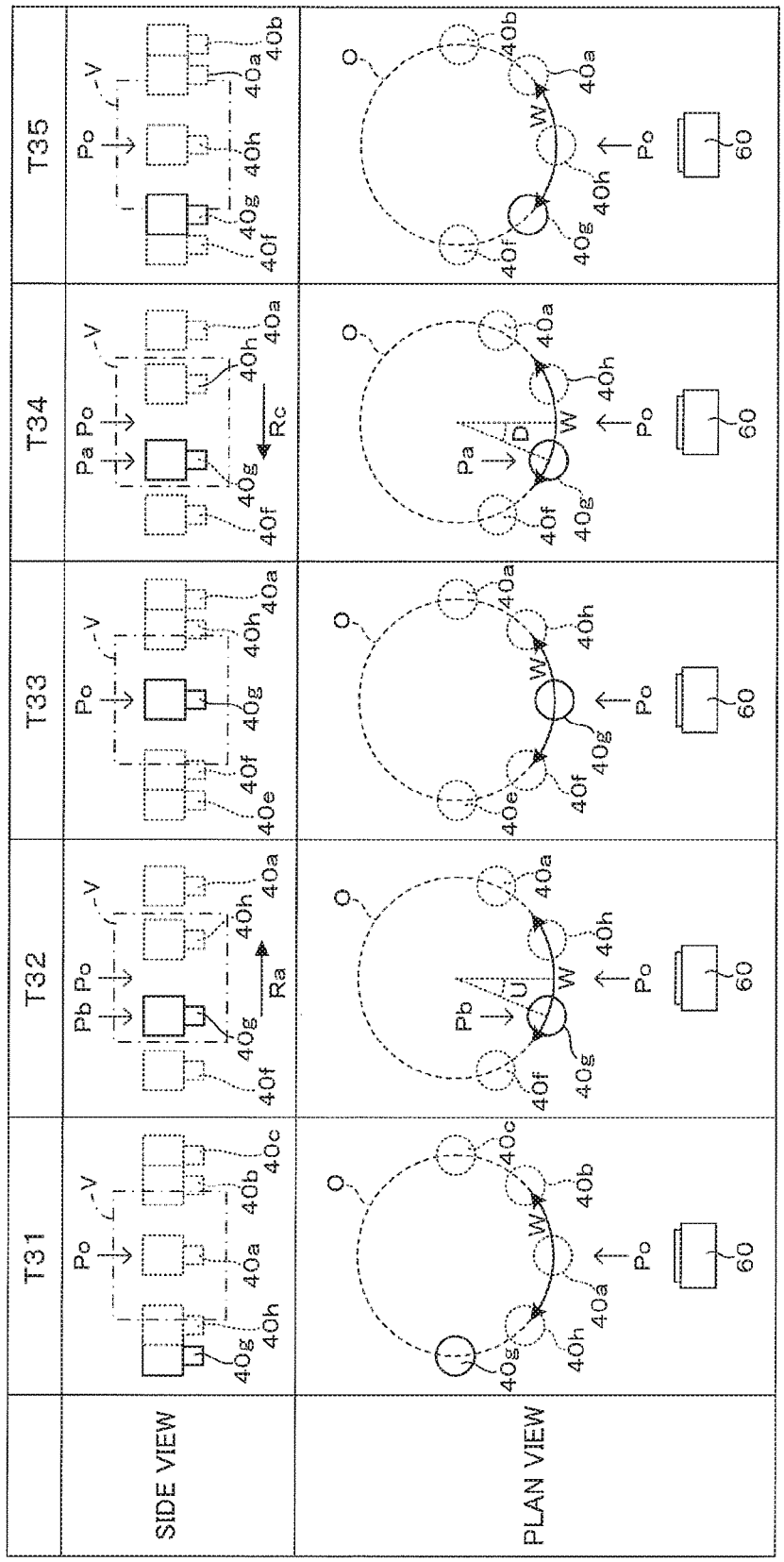
FIG. 8 is a view schematically showing a third example of the side view imaging behavior to the nozzle.

FIG. 8 is a view schematically showing a third example of the side view imaging behavior to the nozzle. Unlike the above-described first and second examples, in the third example, the direction of intermittently rotating the nozzle 40 is reversed in mid-course from counterclockwise to clockwise. Specifically, while the nozzle 40 positioned at the working position Po is changed in the order of 40a, 40g, and 40h by intermittently rotating the plurality of nozzles 40 counterclockwise by twice the center-to-center distance a and then intermittently rotating the plurality of nozzles 40 clockwise by the center-to-center distance a, the operations are performed by these nozzles 40a, 40g, and 40h. Herein, description will be made, centering on the difference between the second example shown in FIG. 7 and the third example shown in FIG. 8, and description of common points of the second and third examples will be omitted as appropriate. The notation of FIG. 8 is the same as that of FIG. 6.

At the timing T31, the nozzle 40a performs an operation at the working position Po. In this while, the nozzle 40g which will perform an operation next stops at a position on the upstream side of the working position Po by twice the center-to-center distance a in the rotation direction Ra. When the operation of the nozzle 40a is completed at the working position Po, the eight nozzles 40a to 40h start rotating in the rotation direction Ra.

In response to the start of rotation, the imaging controller 140 checks the rotation direction of the nozzle 40 and sets the before-operation imaging position Pb used for imaging the nozzle 40g before performing the operation in accordance with the rotation direction which is checked. Herein, the before-operation imaging position Pb is set on the upstream side (the left side in FIG. 8) of the working position Po in the rotation direction Ra of the nozzle 40 which rotates counterclockwise. Then, the camera 60 starts working in conformity with the timing T32 when the nozzle 40g reaches the before-operation imaging position Pb, and the nozzle 40g which is passing the before-operation imaging position Pb is imaged by the camera 60.

At the timing T33, when the nozzle 40g reaches the working position Po, the eight nozzles 40a to 40h stop the rotation in the rotation direction Ra. Thus, the eight nozzles 40a to 40h intermittently rotate by twice the center-to-center distance a in the rotation direction Ra, and the nozzle 40 positioned at the working position Po is changed from the nozzle 40a to the nozzle 40g and the nozzle 40g performs an operation at the working position Po. When the operation of the nozzle 40g is completed at the working position Po, the eight nozzles 40a to 40h start rotating in a rotation direction Rc which is a reverse of the rotation direction Ra.

In response to the start of rotation, the imaging controller 140 checks the rotation direction of the nozzle 40 and sets the after-operation imaging position Pa used for imaging the nozzle 40g after performing the operation in accordance with the rotation direction which is checked. Herein, the after-operation imaging position Pa is set on the downstream side (the left side in FIG. 8) of the working position Po in the rotation direction Rc of the nozzle 40 which rotates clockwise. Then, the camera 60 starts working in conformity with the timing T34 when the nozzle 40g reaches the after-operation imaging position Pa, and the nozzle 40g which is passing the after-operation imaging position Pa is imaged by the camera 60.

At the timing T35, when the nozzle 40h reaches the working position Po, the eight nozzles 40a to 40h stop the rotation in the rotation direction Rc. Thus, the eight nozzles 40a to 40h intermittently rotate by the center-to-center distance a in the rotation direction Rc, and the nozzle 40 positioned at the working position Po is changed from the nozzle 40g to the nozzle 40h and the nozzle 40h performs an operation at the working position Po.

Then, for each of the executions of component adsorption and component mounting, the imaging behavior shown in FIG. 8 is performed. Like in the first example of FIG. 6, also in the third example of FIG. 8, setting of the before-operation imaging position Pb and the after-operation imaging position Pa depends on which of the component adsorption and the component mounting is to be performed.

Figure 9:
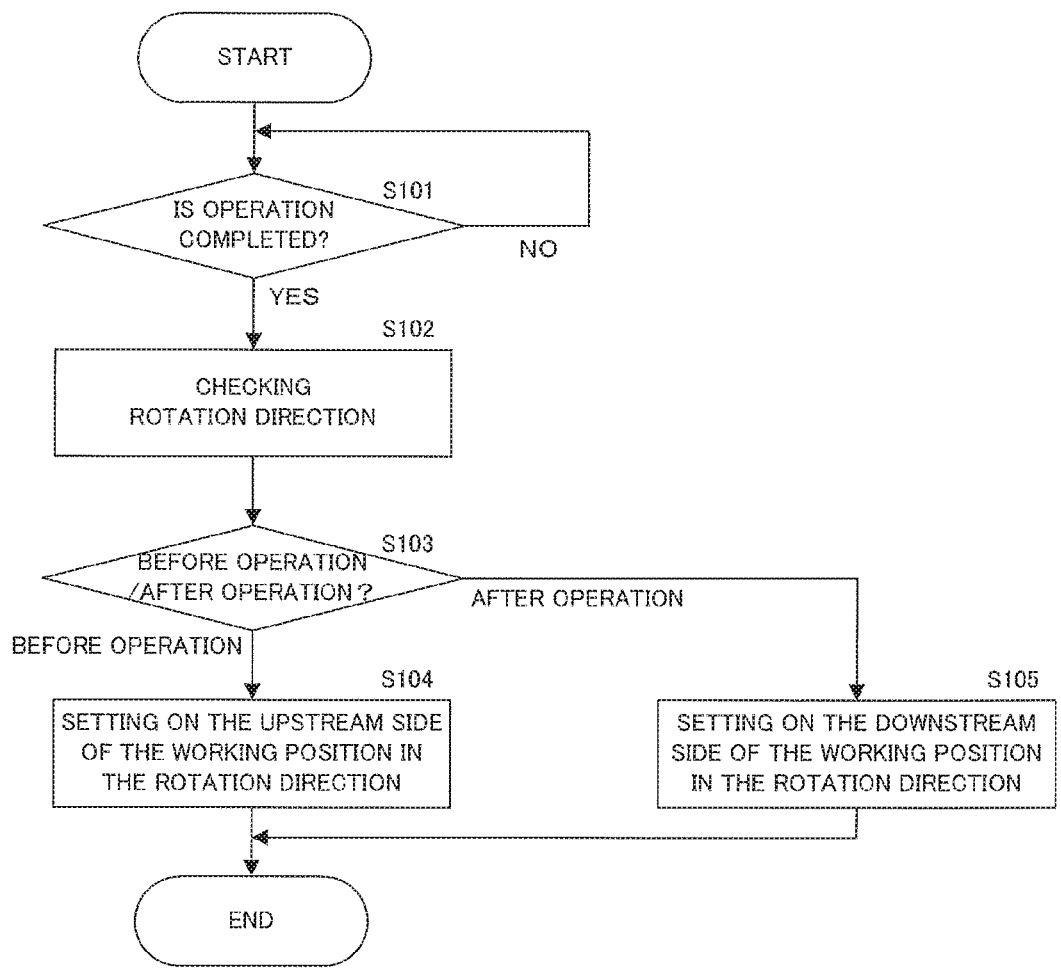
FIG. 9 is a flowchart showing an exemplary control of setting of the imaging position in accordance with the rotation direction of the nozzle.

Thus, in the third example of FIG. 8, the before-operation imaging position Pb and the after-operation imaging position Pa are set in accordance with the rotation direction of the nozzle 40. This setting control is performed in accordance with, for example, the flowchart of FIG. 9. Herein, FIG. 9 is a flowchart showing an exemplary control of setting of the imaging position in accordance with the rotation direction of the nozzle. The flowchart of FIG. 9 is executed by the arithmetic processor 110 in accordance with the program stored in the drive controller 130.

In Step S101, it is determined whether or not the nozzle 40 positioned at the working position Po completes the operation. After the operation at the working position Po is completed ("YES" in Step S101), it is checked whether the direction of the rotation of the nozzle 40 which starts as the operation is completed is the rotation direction Ra or the rotation direction Rc (Step S102). Subsequently, it is checked whether the nozzle 40 to be imaged is before the operation or after the operation (Step S103). Specifically, as to the imaging of the nozzle 40 which will perform an operation at the working position Po next to the nozzle 40 which has performed the operation in Step S101, the nozzle 40 to be imaged is determined to be before the operation ("before the operation" in Step S103), and the process goes to Step S104. Then, in Step S104, the before-operation imaging position Pb is set on the upstream side of the working position Po in the rotation direction R. The nozzle 40 before the operation at the working position Po is thereby imaged. On the other hand, as to the imaging of the nozzle 40 which has performed the operation at the working position Po in Step s101, the nozzle 40 to be imaged is determined to be after the operation ("after the operation" in Step S103), and the process goes to Step S105. Then, in Step S105, the after-operation imaging position Pa is set on the downstream side of the working position Po in the rotation direction R. The flowchart of FIG. 9 is repeatedly executed until the imaging positions of all the nozzles 40 to be imaged during the intermittent rotation which is started after Step S101 are set.

As described above, in the present embodiment, the nozzle 40 positioned at the working position Po is changed by integrally rotating the plurality of nozzles 40 which arranged at intervals of the center-to-center distance a along the circumferential orbit O centering around the predetermined rotation axis C. At that time, regardless of the method of changing the nozzle 40 positioned at the working position Po, the nozzle 40 moving to (approaching) the working position Po and the nozzle 40 moving (going away) from the working position Po move within the imaging target range W having a width smaller than twice the center-to-center distance a with the working position Po as the center along the circumferential orbit O. Then, the camera 60 images the nozzle 40 which is moving within the imaging target range W. In the present embodiment described above, it is not necessary to temporarily stop the nozzle 40 wastefully for the imaging, and as a result, regardless of the method of changing the nozzle 40 positioned at the working position Po, it is possible to efficiently perform the imaging of the nozzle 40.

Particularly, the imaging positions Pa and Pb of the nozzle 40 are within a range smaller than the center-to-center distance a of the nozzle 40 from the working position Po, and are in the proximity of the working position Po. For this reason, advantageously, in a case of imaging at the before-operation imaging position Pb, the nozzle 40 immediately before the operation can be imaged, and in a case of imaging at the after-operation imaging position Pa, the nozzle 40 immediately after the operation can be imaged.

Further, the imaging controller 140 sets the before-operation imaging position Pb and the after-operation imaging position Pa on the basis of the result of determination on whether the movement of the nozzle 40 to be imaged is clockwise or counterclockwise. It is thereby possible to appropriately set the before-operation imaging position Pb and the after-operation imaging position Pa in accordance with the direction in which the nozzle 40 to be imaged moves.

Furthermore, the storage 120 distinguishes between the image data obtained by imaging the nozzle 40 at the before-operation imaging position Pb and the image data obtained by imaging the nozzle 40 at the after-operation imaging position Pa and stores these image data therein. This configuration has an advantage of easily determining whether the image data stored in the storage 120 indicates the nozzle 40 at the before-operation imaging position Pb or the nozzle 40 at the after-operation imaging position Pa.

Further, the camera 60 has one imaging view V including both the before-operation imaging position Pb and the after-operation imaging position Pa. The camera 60 can be thereby relatively easily configured, as compared with a case where respective imaging views V for the before-operation imaging position Pb and the after-operation imaging position Pa are provided.

As described above, in the present embodiment, the component mounter 1 corresponds to an exemplary "component mounter" of the present disclosure, the mounting head 4 corresponds to an exemplary "mounting head" of the present disclosure, the nozzle 40 corresponds to an exemplary "nozzle" of the present disclosure, the imaging controller 140 and the imaging unit 6 functions in cooperation as an exemplary "imaging part" of the present disclosure, the imaging view V corresponds to an exemplary "imaging view" of the present disclosure, the rotation axis C corresponds to an exemplary "rotation axis" of the present disclosure, the circumferential orbit O corresponds to an exemplary "circumferential orbit" of the present disclosure, the center-to-center distance a corresponds to an exemplary "minimum center-to-center distance" of the present disclosure, the working position Po corresponds to an exemplary "working position" of the present disclosure, the before-operation imaging position Pb corresponds to an exemplary "before-operation imaging position" of the present disclosure, the after-operation imaging position Pa corresponds to an exemplary "after-operation imaging position" of the present disclosure, the imaging target range W corresponds to an exemplary "predetermined range" of the present disclosure, and the storage 120 corresponds to an exemplary "storage" of the present disclosure.

The present disclosure is not limited to the above-described embodiment, but numerous modifications and variations can be added to those described above without departing from the scope of the disclosure. In the above-described embodiment, for example, the plurality of nozzles 40 are arranged along the circumferential orbit O at equal intervals of the center-to-center distance a. The intervals of the center-to-center distance a at which the plurality of nozzles 40 are arranged, however, are not required to be equal, but may be different. In this case, among the different center-to-center distances a, the minimum center-to-center distance a corresponds to the "minimum center-to-center distance" of the present disclosure.

Further, in the above-described embodiment, description has been made on the mounting head 4 in which eight nozzles 40 are arranged along the circumferential orbit O. The number of nozzles 40 included in the mounting head 4, however, is not limited to eight, but may be less than eight or more than eight. Therefore, a mounting head 4 having an even number of nozzles 40, not smaller than two, or a mounting head 4 having an odd number of nozzles 40, not smaller than three, may be used.

Furthermore, in the above-described embodiment, as the specific methods of side view imaging behavior to the nozzle 40, shown are the first to third examples of methods with reference to FIGS. 6 to 8. In order to complete the operations of the eight nozzles 40 included in the mounting head 4, only any one of the above-described first to third examples may be performed, or appropriate combination of the first to third examples may be performed. Further, the specific method of side view imaging behavior of the nozzle 40 is not limited to these examples but the side view imaging behavior of the nozzle 40 can be performed by various methods.

Further, though one camera 60 images the before-operation imaging position Pb and the after-operation imaging position Pa, cameras 60 may be provided for the before-operation imaging position Pb and the after-operation imaging position Pa, respectively. In this case, the respective cameras 60 may be arranged so that the cameras 60 can confront the corresponding imaging positions Pb and Pa (in other words, the optical axis of the camera 60 and the rotation axis C of the nozzle holder 42 can be bisect at a right angle each other). In such a configuration, in order to emit light from the back side of the before-operation imaging position Pb or the after-operation imaging position Pa corresponding to each camera 60, it is sufficient for the light diffusion member 5 to have a width which corresponds to one nozzle 40 in the rotation direction R.

Though the mounting head 4 includes two working positions Po, the present disclosure can be applied to a mounting head 4 which includes a single working position Po.

Thus, as described above taking the specific embodiment as an example, in the present disclosure, for example, the component mounter may be configured so that the imaging part images at least one of the nozzle which is moving to the working position before performing the operation at the working position and the nozzle which is moving from the working position after performing the operation at the working position. In other words, since the imaging position of the nozzle is located within the minimum center-to-center distance from the working position in the present disclosure and is in the proximity of the working position, advantageously, the nozzle immediately before the operation can be imaged in the former case, and the nozzle immediately after the operation can be imaged in the latter case.

The component mounter may be configured so that the imaging part sets a before-operation imaging position on an upstream side of the working position in a moving direction of the nozzle within the predetermined range and images the nozzle which is passing the before-operation imaging position before performing the operation. In such a configuration, the nozzle immediately before the operation, which is passing the before-operation imaging position set in the proximity of the working position, can be imaged.

The component mounter may be configured so that the plurality of nozzles are configured to move both in a clockwise direction and in a counterclockwise direction centering around the rotation axis, and the imaging part sets the before-operation imaging position on the basis of a result of determination on whether the nozzle to be imaged moves in the clockwise direction or in the counterclockwise direction. It is thereby possible to appropriately set the before-operation imaging position in accordance with the direction in which the nozzle to be imaged moves.

The component mounter may be configured so that the imaging part images the nozzle before performing mounting of a component at the working position. In other words, since the nozzle which is moving to the working position for the component mounting is imaged in the present disclosure, the present disclosure is suitable for checking an error that the component falls out from the nozzle due to the inertial force which is acting when the nozzle starts moving to the working position for the component mounting.

The component mounter may be configured so that the imaging part sets an after-operation imaging position on a downstream side of the working position in a moving direction of the nozzle within the predetermined range and images the nozzle which is passing the after-operation imaging position after performing the operation. In such a configuration, the nozzle immediately after the operation, which is passing the after-operation imaging position set in the proximity of the working position, can be imaged.

The component mounter may be configured so that the plurality of nozzles are configured to move both in a clockwise direction and in a counterclockwise direction centering around the rotation axis, and the imaging part sets the after-operation imaging position on the basis of a result of determination on whether the nozzle to be imaged moves in the clockwise direction or in the counterclockwise direction. It is thereby possible to appropriately set the after-operation imaging position in accordance with the direction in which the nozzle to be imaged moves.

The component mounter may be configured so that the imaging part sets a before-operation imaging position on an upstream side of the working position in a moving direction of the nozzle within the predetermined range and images the nozzle which is passing the before-operation imaging position before performing the operation, and sets an after-operation imaging position on a downstream side of the working position in a moving direction of the nozzle within the predetermined range and images the nozzle which is passing the after-operation imaging position after performing the operation. The respective nozzles immediately before and immediately after the operation, which are passing the before-operation imaging position and the after-operation imaging position, respectively, set in the proximity of the working position, can be imaged.

The component mounter may be configured so that the imaging part images the nozzle which performs component mounting as the operation and sets the before-operation imaging position and the after-operation imaging position so that a distance between the before-operation imaging position and the working position is larger than a distance between the after-operation imaging position and the working position on the circumferential orbit. In such a configuration, since the distance between the before-operation imaging position and the working position is set long, it is possible to ensure the time period required until the nozzle, which is confirmed by the imaging at the before-operation imaging position that the component falls out from, reaches the working position. As a result, it becomes possible to perform control to complete a process necessary to stop the component mounting during the ensured time period and prevent the nozzle holding no component from moving down at the working position to come into contact with the board.

The component mounter may be configured so that the imaging part images the nozzle which performs component holding as the operation and sets the before-operation imaging position and the after-operation imaging position so that a distance between the before-operation imaging position and the working position is equal to a distance between the after-operation imaging position and the working position on the circumferential orbit.

The component mounter may be configured so that the mounting head causes one nozzle out of the plurality of nozzles to be positioned at the working position and to perform the operation, and subsequently causes a next nozzle adjacent to the one nozzle on the circumferential orbit to be positioned at the working position and to perform the operation, and the imaging part performs imaging of the one nozzle which is passing the after-operation imaging position after performing the operation and imaging of the next nozzle which is passing the before-operation imaging position before performing the operation at the same time. In such a configuration, since one nozzle and the next nozzle are imaged at the same time, these imaging can be efficiently performed.

The component mounter may further comprises: a storage stores image data of the nozzle imaged by the imaging part, and be configured so that the storage distinguishes between the image data obtained by imaging the nozzle at the before-operation imaging position and the image data obtained by imaging the nozzle at the after-operation imaging position and stores these image data. Such a configuration has an advantage of easily determining whether the image data stored in the storage indicate the nozzle at the before-operation imaging position or that at the after-operation imaging position.

The component mounter may be configured so that the imaging part includes both the before-operation imaging position and the after-operation imaging position in the one imaging view. The imaging part can be thereby relatively easily configured, as compared with a case where respective imaging views for the before-operation imaging position and the after-operation imaging position are provided.

What is claimed is:

1. A component mounter, comprising:
a mounting head configured to rotate a plurality of nozzles arranged at intervals of at least minimum center-to-center distance along a circumferential orbit centering around a predetermined rotation axis integrally, cause one of the nozzles positioned at a predetermined working position on the circumferential orbit to perform at least one operation of holding and mounting of a component by moving the one of the nozzles up and down at the predetermined working position, and position a different one of the nozzles at the working position by rotating the plurality of nozzles integrally; and
an imager configured to include the circumferential orbit in an imaging view, and image two of the nozzles which are adjacent to each other, positioned at different points from the working position, and moving within a predetermined range having a width smaller than twice the minimum center-to-center distance with the working position as the center along the circumferential orbit.

2. The component mounter according to claim 1, wherein the imager is configured to image at least one of the following:
any of the nozzles which is moving to the working position before being positioned as the one of the nozzles that performs the operation at the working position; and
the one of the nozzles which is moving from the working position after performing the operation at the working position.

3. The component mounter according to claim 2, wherein:
the imager sets a before-operation imaging position on an upstream side of the working position in a moving direction of the nozzles within the predetermined range and images the any of the nozzles which is passing the before-operation imaging position before being positioned as the one of the nozzles that performs the operation.

4. The component mounter according to claim 3, wherein:
the plurality of nozzles are configured to move both in a clockwise direction and in a counterclockwise direction centering around the rotation axis; and
the imager sets the before-operation imaging position on the basis of a result of determination on whether the any of the nozzles to be imaged moves in the clockwise direction or in the counterclockwise direction.

5. The component mounter according to claim 4, wherein:
the imager sets an after-operation imaging position on a downstream side of the working position in a moving direction of the nozzles within the predetermined range and images the one of the nozzles which is passing the after-operation imaging position after performing the operation.

6. The component mounter according to claim 2, wherein the imager images any of the nozzles before being positioned as the one of the nozzles and performing mounting of the component at the working position.

7. The component mounter according to claim 6, wherein:
the imager sets an after-operation imaging position on a downstream side of the working position in a moving direction of the nozzles within the predetermined range and images the one of the nozzles which is passing the after-operation imaging position after performing the operation.

8. The component mounter according to claim 7, wherein:
the plurality of nozzles are configured to move both in a clockwise direction and in a counterclockwise direction centering around the rotation axis; and
the imager sets the after-operation imaging position on the basis of a result of determination on whether the one of the nozzles to be imaged moves in the clockwise direction or in the counterclockwise direction.

9. The component mounter according to claim 2, wherein:
the imager sets an after-operation imaging position on a downstream side of the working position in a moving direction of the nozzles within the predetermined range and images the one of the nozzles which is passing the after-operation imaging position after performing the operation.

10. The component mounter according to claim 9, wherein:
the plurality of nozzles are configured to move both in a clockwise direction and in a counterclockwise direction centering around the rotation axis; and
the imager sets the after-operation imaging position on the basis of a result of determination on whether the one of the nozzles to be imaged moves in the clockwise direction or in the counterclockwise direction.

11. The component mounter according to claim 2, wherein:
the imager sets a before-operation imaging position on an upstream side of the working position in a moving direction of the nozzles within the predetermined range and images the any of the nozzles which is passing the before-operation imaging position before being positioned as the one of the nozzles that performs the operation, and sets an after-operation imaging position on a downstream side of the working position in a moving direction of the nozzles within the predetermined range and images the one of the nozzles which is passing the after-operation imaging position after performing the operation.

12. The component mounter according to claim 11, wherein:
the imager images the one of the nozzles which performs component mounting as the operation and sets the before-operation imaging position and the after-operation imaging position so that a distance between the before-operation imaging position and the working position is larger than a distance between the after-operation imaging position and the working position on the circumferential orbit.

13. The component mounter according to claim 12, wherein:
the mounting head causes the one of the nozzles out of the plurality of nozzles to be positioned at the working position and to perform the operation, and subsequently causes a next one of the nozzles adjacent to the one of the nozzles on the circumferential orbit to be positioned at the working position and to perform the operation; and
the imager performs imaging of the one of the nozzles which is passing the after-operation imaging position after performing the operation and imaging of the next one of the nozzles which is passing the before-operation imaging position before performing the operation, at the same time.

14. The component mounter according to claim 12, further comprising:
a storage configured to store image data of those of the nozzles imaged by the imager;
wherein the storage distinguishes between the image data obtained by imaging the any of the nozzles at the before-operation imaging position and the image data obtained by imaging the one of the nozzles at the after-operation imaging position, and stores these image data.

15. The component mounter according to claim 11, wherein:
the imager images the one of the nozzles which performs component holding as the operation and sets the before-operation imaging position and the after-operation imaging position so that a distance between the before-operation imaging position and the working position is equal to a distance between the after-operation imaging position and the working position on the circumferential orbit.

16. The component mounter according to claim 15, wherein:
the mounting head causes the one of the nozzles out of the plurality of nozzles to be positioned at the working position and to perform the operation, and subsequently causes a next one of the nozzles adjacent to the one of the nozzles on the circumferential orbit to be positioned at the working position and to perform the operation; and the imager performs imaging of the one of the nozzles which is passing the after-operation imaging position after performing the operation and imaging of the next one of the nozzles which is passing the before-operation imaging position before performing the operation, at the same time.

17. The component mounter according to claim 11, wherein:
the mounting head causes the one of the nozzles out of the plurality of nozzles to be positioned at the working position and to perform the operation, and subsequently causes a next one of the nozzles adjacent to the one of the nozzles on the circumferential orbit to be positioned at the working position and to perform the operation; and the imager performs imaging of the one of the nozzles which is passing the after-operation imaging position after performing the operation and imaging of the next one of the nozzles which is passing the before-operation imaging position before performing the operation, at the same time.

18. The component mounter according to claim 11, further comprising:
a storage configured to store image data of those of the nozzles imaged by the imager;

wherein the storage distinguishes between the image data obtained by imaging the any of the nozzles at the before-operation imaging position and the image data obtained by imaging the one of the nozzles at the after-operation imaging position, and stores these image data.

19. The component mounter according to claim 11, wherein
the imager includes both the before-operation imaging position and the after-operation imaging position in one imaging view.

20. A nozzle imaging method, comprising:
rotating a plurality of nozzles of a mounting head integrally to thereby position one of the nozzles at a predetermined working position provided on a circumferential orbit centering around a predetermined rotation axis, the mounting head having the plurality of nozzles arranged at intervals of at least minimum center-to-center distance along the circumferential orbit and causing the one of the nozzles to perform at least one operation of holding and mounting of a component by moving the one of the nozzles up and down at the working position; and imaging two of the nozzles which are adjacent to each other, positioned at different points from the working position, and moving within a predetermined range having a width smaller than twice the minimum center-to-center distance with the working position as the center along the circumferential orbit.

* * * * *